US012334881B2

(12) United States Patent
Lomen et al.

(10) Patent No.: US 12,334,881 B2
(45) Date of Patent: Jun. 17, 2025

(54) WIDEBAND FREQUENCY CONVERTER

(71) Applicant: BAE SYSTEMS Information and Electronic Systems Integration Inc., Nashua, NH (US)

(72) Inventors: Brandt J. Lomen, Bedford, NH (US); John Kimball, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 426 days.

(21) Appl. No.: 18/080,302

(22) Filed: Dec. 13, 2022

(65) Prior Publication Data
US 2024/0195365 A1 Jun. 13, 2024

(51) Int. Cl.
*H04B 1/00* (2006.01)
*H03F 3/195* (2006.01)

(52) U.S. Cl.
CPC .......... *H03F 3/195* (2013.01); *H04B 1/0096* (2013.01); *H03F 2200/451* (2013.01)

(58) Field of Classification Search
CPC . H03F 3/195; H03F 2200/451; H04B 1/0096; H03D 7/00
USPC ...................................................... 455/552.1
See application file for complete search history.

(56) References Cited

U.S. PATENT DOCUMENTS

| 6,584,304 | B1* | 6/2003 | Thomsen | H04B 1/0092 |
| | | | | 455/188.1 |
| 9,037,104 | B2* | 5/2015 | Fernando | H04B 1/0028 |
| | | | | 455/323 |
| 2010/0325669 | A1* | 12/2010 | Tsai | H03D 7/00 |
| | | | | 455/189.1 |
| 2019/0158134 | A1* | 5/2019 | Espana Fresno | G01R 23/175 |
| 2021/0067186 | A1* | 3/2021 | Beaudin | H04B 1/401 |

OTHER PUBLICATIONS

"Adam, VA7OJ/AB4OJ's IC-756Pro/Pro II User Review," last revised—Oct. 18, 2019. 32 pages.
"2 GHz to 18 GHz, Digitally Tunable, High-Pass and Low-Pass Filter," Analog Devices, Enhanced Product—ADMV8818-EP, 2021. 36 pages.
Low Noise Amplifier, 0.01 GHz to 9 GHz, Analog Devices, Data Sheet—HMC8413, 2021. 21 page.

(Continued)

*Primary Examiner* — Tanmay K Shah
(74) *Attorney, Agent, or Firm* — Scott J. Asmus

(57) ABSTRACT

An apparatus for converting frequency of signals includes a first switch having a first input terminal to receive a first input signal, a first output terminal, and a second output terminal, wherein the first switch couples the first input terminal to either the first or the second output terminal. A mixer circuit is coupled to the second output terminal, and is to mix the first input signal to a second input signal, to generate a modified input signal. A filter circuit includes a plurality of programmable filters, to receive the modified input signal and output a filtered signal. A second switch has (i) a second input terminal coupled to the first output terminal, (ii) a third input terminal to receive the filtered signal, and (iii) a third output terminal, wherein the second switch is to couple the third output terminal to either the second or third input terminal.

20 Claims, 6 Drawing Sheets

(56) References Cited

OTHER PUBLICATIONS

Silicon SPDT Switch, Nonreflective, 100 MHz to 44 GHz, Analog Devices, Data Sheet—ADRF5026, 2018-2020. 13 pages.
Wideband, Low Noise Amplifier, Single Positive Supply, 0.01 GHz to 26.5 GHz, Data Sheet—ADL9005, 2021-2022. 24 pages.
Al-Rawi, Muhanned, "Design of 2.4 GHZ Transceiver for Wireless Communications," Sciendo, Land Forces Academy Review, vol. XXIV, No. 3(95), 2019. pp. 232-241.
Kang, et al., "Implementation of Filter Bank-Based RF Transceiver for TV White Space," ETRI Journal, vol. 37, No. 6, Dec. 2015. pp. 1077-1086.
"3 GHz to 20GHz Microwave Mixer," Linear Technology, Now part of Analog Devices, LTC5553, 2017. 16 pages.
Steer, Michael, "3.4: Receiver and Transmitter Architectures," shared under a CC BY-NC license. 4 pages.

* cited by examiner

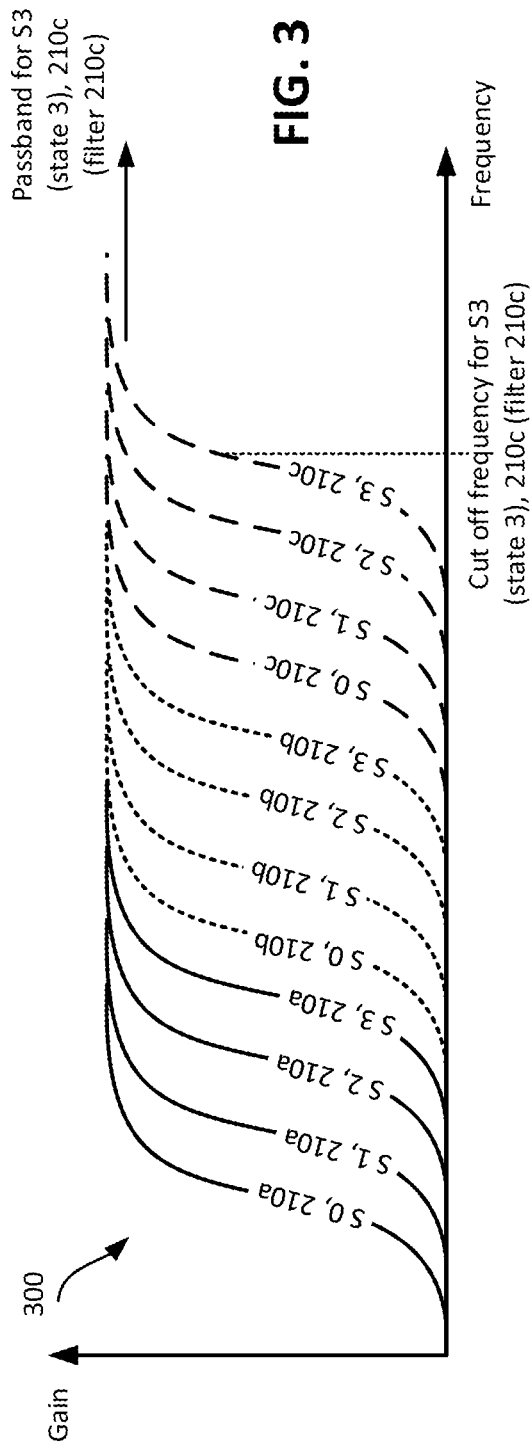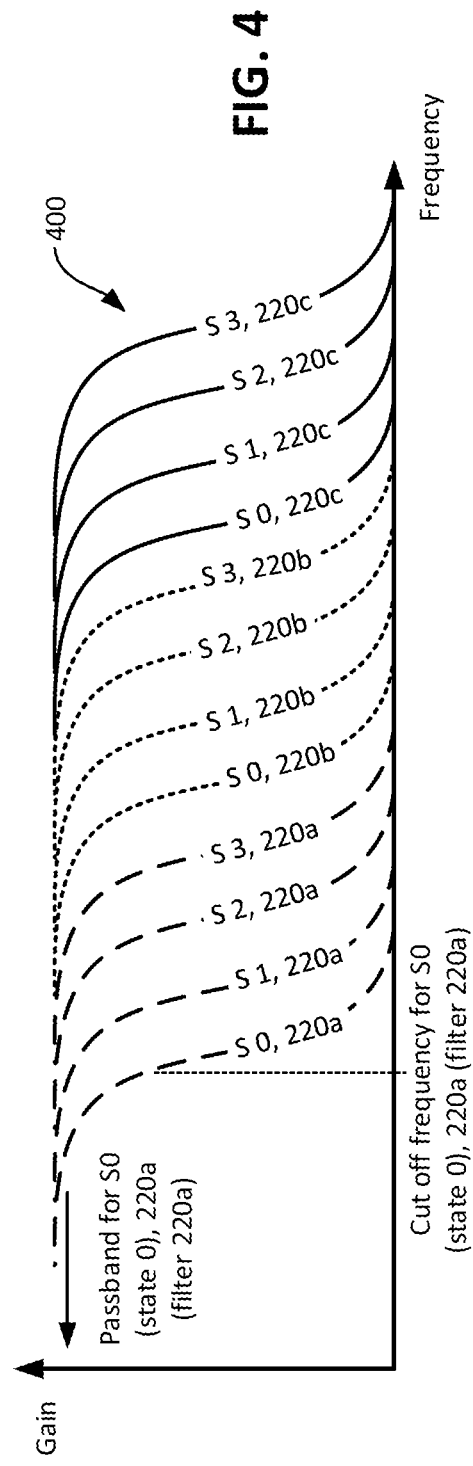

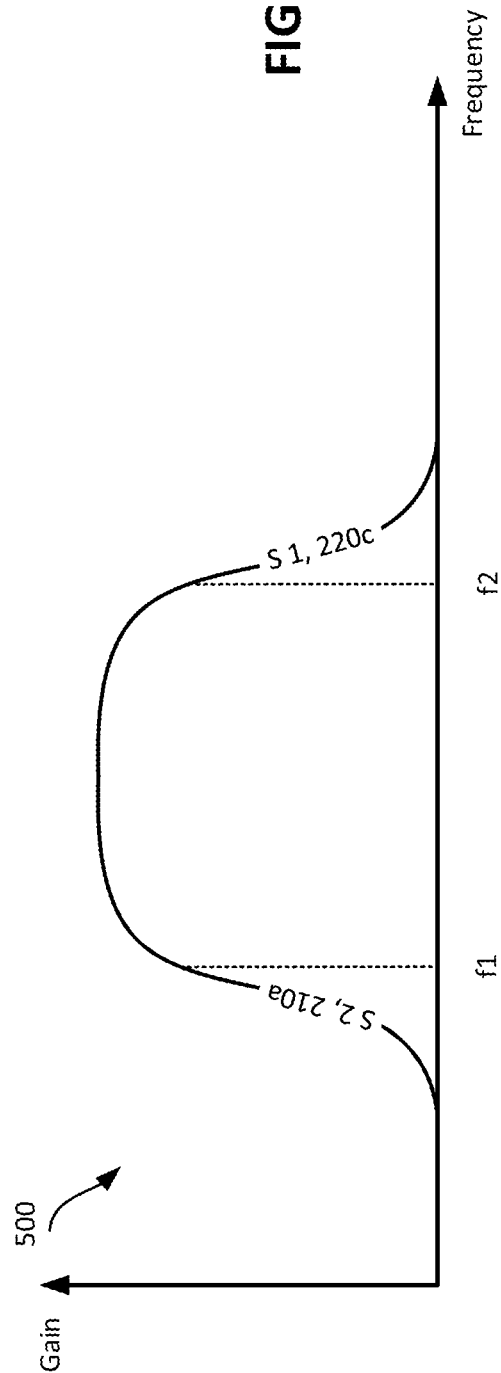

WIDEBAND FREQUENCY CONVERTER

FIELD OF THE DISCLOSURE

The present disclosure relates to radio frequency (RF) systems, and more particularly, to frequency converter architectures for RF systems.

BACKGROUND

Frequency converters are widely used in radio frequency systems. Radio frequency (RF) converters can include upconverters that change an input signal with a relatively lower frequency to a relatively higher frequency output signal, while optionally also changing an amplitude of the signal. Downconverters change an input signal with a relatively higher frequency to a relatively lower frequency output signal, while optionally also changing an amplitude of the signal. Some RF frequency converters can shift or change the frequency both up and down. A given frequency converter has a corresponding frequency range of operation. There remain a number of non-trivial challenges with respect to designing and operating a frequency converter for RF systems.

BRIEF DESCRIPTION OF THE DRAWINGS

FIG. 3 illustrate a graph depicting filter characteristics of example states of operation of example high-pass filters of the programmable filter circuit of FIGS. 1 and 2, according to an embodiment of the present disclosure.

FIG. 4 illustrate a graph depicting filter characteristics of example states of operation of example low-pass filters of the programmable filter circuit of FIGS. 1 and 2, according to an embodiment of the present disclosure.

FIG. 5 illustrate a graph depicting filter characteristics during an example operation of the programmable filter circuit of FIGS. 1 and 2, according to an embodiment of the present disclosure.

Figure 1:
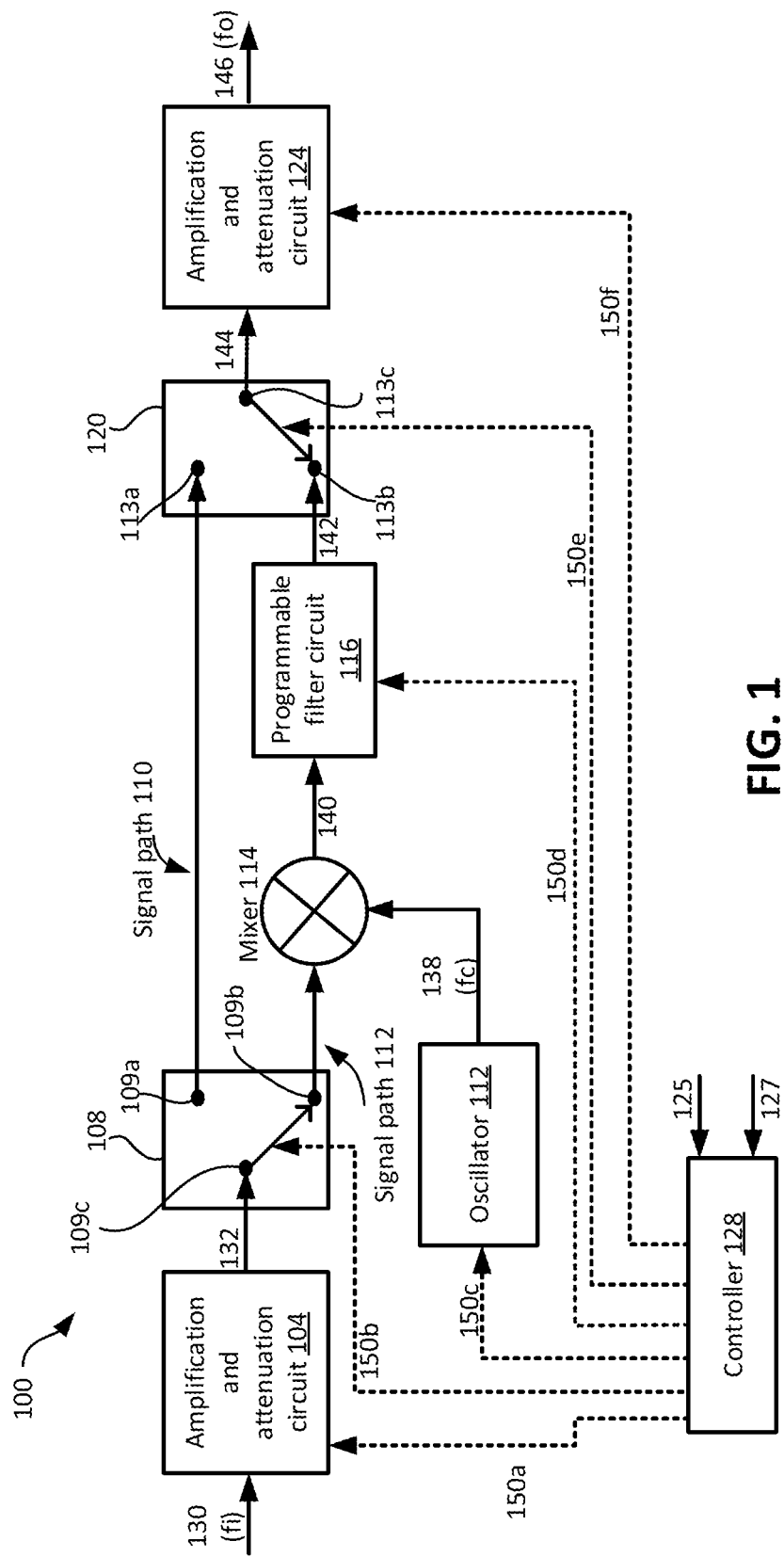
FIG. 1 illustrate a frequency converter system for converting a frequency fi of an input signal, to generate an output signal having a frequency fo different from the frequency fi of the input signal, according to an embodiment of the present disclosure.

As will be appreciated, the figures are not necessarily drawn to scale or intended to limit the present disclosure to the specific configurations shown. Although the following detailed description will proceed with reference being made to illustrative examples, many alternatives, modifications, and variations thereof will be apparent in light of this disclosure.

DETAILED DESCRIPTION

Techniques are provided herein to form an adaptable wideband frequency converter system that upconverts a frequency fi of an input signal, to generate an output signal having a frequency fo that is higher than the frequency of the input signal. In an example, the frequency converter system has two signal paths: a first signal path that doesn't alter the frequency fi of the input signal, and a second signal path that alters the frequency fi of the input signal. A controller controls transmission of the input signal to either the first or second signal paths, e.g., based on whether a change of frequency of the input signal is intended. In one embodiment, the second signal path comprises a frequency mixer that mixes the input signal with a signal from a local oscillator having a frequency of fc. In one such example, the mixer is a heterodyne mixer, and the mixer generates a modified input signal having a sum frequency component having a frequency of (fi+fc) and a difference frequency component having a frequency of |fi−fc|. The second signal path further comprises a programmable filter circuit including (i) a plurality of high-pass filters arranged in parallel, and (ii) a plurality of low-pass filters arranged in parallel. The bank of high-pass filters arranged in parallel is in series with the bank of low-pass filters arranged in parallel. In an example, each high-pass and low-pass filter is programmable or tunable in the sense that each high-pass and low-pass filter can operate in one of a plurality of operation states. In an example, each state of a high-pass or low-pass filter is associated with a corresponding passband and a corresponding cutoff frequency. At any given time of operation, the controller can adapt the frequency converter system to a given set of input signals by selecting a specific high-pass filter and a specific state of operation of the selected high-pass filter, as well as a specific low-pass filter and a specific state operation of the selected low-pass filter. Thus, a specific passband of the selected high-pass filter and a specific passband of the selected low-pass filter is achievable. In this manner, a highly-configurable bandpass filter is provided. In some such examples, an input amplification and attenuation circuit may amplify the input signal, e.g., prior to the input signal being transmitted to the first or second signal paths, and/or an output amplification and attenuation circuit may amplify the output of the first or second signal paths. Numerous configurations and variations will be apparent in light of this disclosure.

General Overview

As previously noted above, there remain a number of non-trivial challenges with respect to designing and operating a frequency converter for RF systems. For example, a frequency converter system may use a frequency multiplier, which mixes an input signal to itself, to generate a signal having a frequency higher than a frequency of the input signal. However, such a frequency multiplier may produce multiple mixing spurs, e.g., when the input signal has multiple frequency components. Additionally, mixing an input signal to itself reduces flexibility in achieving a target output frequency, as only certain multiples of input frequency may be achieved by the frequency multiplier. Another frequency converter system may use a frequency mixer, but filtering the mixed signal using one or more filters, to achieve a target frequency, may be challenging.

Thus, and in accordance with an embodiment of the present disclosure, techniques are provided herein to design and operate a frequency converter system that uses a frequency mixer and programmable filter circuit comprising a plurality of programmable high-pass filters and a plurality of programmable low-pass filters. In one embodiment, each high-pass and low-pass filter is programmable or tunable in the sense that each high-pass and low-pass filter can operate in one of a plurality of operation states. In an example, each state of a high-pass or low-pass filter is associated with a corresponding passband and a corresponding cutoff frequency. Thus, a plurality of candidate passbands and corresponding cutoff frequencies are available for selection for the high-pass and low-pass filters, and an appropriate passband for the high-pass filter and an appropriate passband for the low-pass filter can be selected for filtering the output of the frequency mixer. This improves the filtering resolution and frequency range of operation, in achieving a target output frequency. In one such example, each of the high-pass and low-pass filters has a 4-bit configurable resolution, thus allowing for up to 16 distinct filter candidates for each of the low-pass corner frequency and the high-pass corner frequency of the resulting bandpass filter. So, for such a configuration having N low-pass filters and N high-pass filters, a frequency converter system is provided having a configurable bandpass filter resolution of N*16 for each of the lower cutoff frequency and the upper cutoff frequency. Thus, because of the multiple available candidate passbands and corresponding cutoff frequencies, the filter circuit and consequently the frequency converter is highly-configurable and has a relatively wideband frequency range of operation.

In an example, the frequency converter system has an input amplification and attenuation circuit that may amplify an input signal having a frequency of fi, to generate an amplified input signal. The input amplification and attenuation circuit includes one or more amplifiers and/or attenuators. In one such example, one or more of the amplifiers and/or attenuators have gains or attenuation factors controlled by a controller, e.g., to control the overall gain of the input amplification and attenuation circuit and/or to compensate for (e.g., eliminate or at least reduce) variation in gains of the amplifiers in view of temperature variation.

An output of the input amplification and attenuation circuit (e.g., the amplified input signal) is provided to a first switch (e.g., a single input-double output switch), and which can transmit the amplified input signal to either a first signal path or a second signal path. In one embodiment, the first signal path doesn't have any component that can alter a frequency of the amplified input signal. Thus, if no frequency conversion of the input signal is desired, the amplified input signal is transmitted, through the first signal path, to a second switch. However, if frequency conversion is desired, the amplified input signal is transmitted by the first switch to the second signal path. The operation of the first switch is controlled by a controller, e.g., based on configuration data received by the controller.

The second signal path comprises a frequency mixer configured to receive the amplified input signal from the first switch, and to receive a signal from a local oscillator having a frequency fc. In one example, the mixer is a heterodyne mixer, and the mixer generates a modified input signal having a sum frequency component with a frequency of (fi+fc) and a difference frequency component with a frequency of |fi−fc|.

The second signal path further comprises the programmable filter circuit including (i) a plurality of high-pass filters arranged in parallel, and (ii) a plurality of low-pass filters arranged in parallel. The bank of high-pass filters arranged in parallel is in series with the bank of low-pass filters arranged in parallel. In an example, each high-pass and low-pass filter is programmable or tunable in the sense that each high-pass and low-pass filter can operate in one of a plurality of operation states. In an example, each state of a high-pass or low-pass filter is associated with a corresponding passband and a corresponding cutoff frequency.

Thus, if there are N number of high-pass filters each having P number of states of operation, then (N×P) number of passbands may be achievable using the bank of high-pass filters. Similarly, if there are M number of low-pass filters each having Q number of states of operation, then (M×Q) number of passbands may be achievable using the bank of low-pass filters.

At any given time of operation, the controller selects a specific high-pass filter and a specific state of operation of the selected high-pass filter. Similarly, at any given time of operation, the controller also selects a specific low-pass filter and a specific state operation of the selected low-pass filter. Thus, a specific passband of the selected high-pass filter and a specific passband of the selected low-pass filter is achievable. Hence, the filter circuit achieves a bandpass filter having a configurable passband. The passband is configurable by the controller, e.g., by selecting a high-pass filter and a low-pass filter and their corresponding states of operation. The programmable filter circuit filters the output of the mixer using (i) the selected high-pass filter operating at the selected corresponding state of operation and (ii) the selected low-pass filter operating at the selected corresponding state of operation, to effectively achieve a bandpass filter and generate a filtered signal.

Continuing with the above example where the mixer output comprises a difference frequency of |fc−fi| and a sum frequency of (fc+fi), it may be intended that the programmable filter circuit attenuate one of the difference frequency or sum frequency, and pass the other of the difference frequency or sum frequency. The passband of the filter circuit may be appropriately set by the controller to achieve the target frequency output. Note that the frequency fc from the oscillator may be tuned or controlled by a user, e.g., by controlling the oscillator through the controller. The passband of the programmable filter circuit may also be correspondingly tuned by the controller. Accordingly, a frequency of the filtered signal output by the programmable filter circuit is configurable and controllable by the controller.

A second switch has two inputs and one output. For example, a first input terminal of the second switch receives the signal from the first signal path (note that a frequency of the signal transmitted via the first signal path has not been altered). A second input terminal of the second switch receives the filtered signal from the programmable filter circuit. An output terminal of the second switch is coupled to either the first input terminal or the second input terminal, e.g., depending on whether the first switch transmitted the amplified input signal over the first signal path or the second signal path.

In some such embodiments, the frequency converter system may also include an output amplification and attenuation circuit that amplifies the output of the second switch. Similar to the input amplification and attenuation circuit, the output amplification and attenuation circuit may also include one or more attenuators and/or one or more amplifiers, at least some of which may be controlled by the controller, e.g., to compensate (e.g., eliminate or reduce) effects of temperature variation and/or to set a target gain of the output amplification and attenuation circuit. Numerous configurations and variations will be apparent in light of this disclosure.

Architecture

FIG. 1 illustrate a frequency converter system 100 (also referred to herein as system 100) for converting a frequency fi of an input signal 130, to generate an output signal 146 having a frequency fo different from the frequency fi of the input signal 130, according to an embodiment of the present disclosure. In an example, the system 100 may function as a frequency upconverter system, e.g., where the frequency fo of the output signal 146 is higher than the frequency fi of the input signal 130. However, in some other examples, the system 100 may also be used as a frequency down converter system, as will be discussed herein in turn.

In an example, the input signal 130 (also referred to herein simply as signal 130) may be generated by an appropriate digital or analog component, while the output signal 146 may be coupled to an antenna for transmission. For example, the input signal 130 may be generated by a digital to analog converter (DAC). For example, the DAC (not illustrated in FIG. 1) may convert a digital signal to the analog input signal 130. In another example, the analog input signal 130 may be generated by another appropriate radio frequency (RF) component. In an example, the input signal 130 may be at an appropriate frequency fi, where frequency fi may be at a RF range, e.g., between 100 kHz and 300 GHz.

The system 100 comprises an amplification and attenuation circuit 104 configured to receive the input signal 130. The amplification and attenuation circuit 104 amplifies and/or attenuates the input signal 130, to generate an amplified input signal 132 (also referred to herein simply as signal 132). The amplification and attenuation circuit 104 may comprise one or more signal amplifiers and/or one or more signal attenuators, which alter an amplitude of the input signal 130, e.g., without altering a frequency of the input signal 130, based on a gain of the amplification and attenuation circuit 104. The amplification and attenuation circuit 104 will be discussed herein below with respect to FIG. 6.

In one embodiment, the system 100 comprises a controller 128 that generates a plurality of control signals 150a, . . . , 150f, to control a corresponding plurality of components of the system 100. In an example, functionalities of the controller 128 may be implemented through hardware, firmware, and/or software. For example, the controller 128 may comprise a processor that executes instructions stored in a computer readable storage medium, such as a memory, to implement one or more functionalities of the controller 128. In another example, one or more functionalities of the controller 128 may be implemented through hardware, e.g., using a dedicated control circuit, such as an application specific integrated circuit (ASIC). In yet another example, one or more functionalities of the controller 128 may be implemented through a combination of software, firmware, and/or hardware.

In one embodiment, an operation of the amplification and attenuation circuit 104 may be based on a temperature of the amplification and attenuation circuit 104, and/or a target gain of the amplification and attenuation circuit 104. For example, a change in temperature may affect a gain of the amplification and attenuation circuit 104. Accordingly, in some embodiments, the amplification and attenuation circuit 104 may receive a control signal 150a from the controller 128, which may be used to tune the amplification and attenuation circuit 104, to eliminate or at least reduce effects of temperature variation on an operation of the amplification and attenuation circuit 104. For example, the controller 128 may receive temperature measurement data 125 from one or more sensors measuring temperature at or near of one or more components of the system 100 (such as a temperature of a circuit board on which at least a part of the system 100 is implemented). Based on the temperature measurement data 125, the controller 128 may generate the control signal 150a, to reduce or eliminate effects of temperature on the operation of the amplification and attenuation circuit 104. In an example, the control signal 150a may also be used to control a gain of the amplification and attenuation circuit 104.

The amplified input signal 132 generated by the amplification and attenuation circuit 104 is received by a switch 108 of the system 100. The switch 108 is a single input/two output switch, where an input terminal 109c of the switch 108 receives the amplified input signal 132, a first output terminal 109a of the switch 108 is coupled to a first signal path 110, and a second output terminal 109b of the switch 108 is coupled to a second signal path 112. In an example, the switch 108 may be implemented as a single pole double throw (SPDT) switch, or as a demultiplexer.

In a first state of operation, the switch 108 couples the input terminal 109c to the output terminal 109a, and transmits the amplified input signal 132 to the first signal path 110. In a second state of operation, the switch 108 couples the input terminal 109c to the output terminal 109b, and transmits the amplified input signal 132 to the second signal path 112.

In an example, the controller 128 controls a state of operation of the switch 108, e.g., whether the switch 108 switches the amplified input signal 132 to the signal path 110 or to the signal path 112. For example, the controller 112 generates a control signal 150b, based on configuration data 127 received by the controller 128. The control signal 150b controls the state of operation of the switch 108.

The signal path 110 is between the output terminal 109a of the switch 108 and an input terminal 113a of another switch 120, whereas the signal path 112 is between the output terminal 109b of the switch 108 and an input terminal 113b of the other switch 120. As will be described in further detail in turn, the signal path 110 doesn't include any component that can substantially alter a frequency of the signal 132, whereas the signal path 112 includes components (such as a mixer 114 and a programmable filter circuit 116) that can substantially alter a frequency of the signal 132.

In an example, the configuration data 127 (which may be configurable by a user or by another appropriate system, for example, to control operations of the system 100) specifies whether the frequency fi of the signal 130 is to be altered or not by the system 100. If the frequency fi of the signal 130 is to be not altered, the control signal 150b generated by the controller 128 causes the switch 108 to operate in the above discussed first state of operation, where the switch 108 couples the input terminal 109c to the output terminal 109a, and transmits the signal 132 to the first signal path 110 (e.g., such that the frequency fi of the signal 132 is not altered by the signal path 110).

On the other hand, if the frequency fi of the signal 132 is to be altered by the system 100, the control signal 150b generated by the controller 128 causes the switch 108 to operate in the above discussed second state of operation. In the second state of operation, the switch 108 couples the input terminal 109c to the output terminal 109b, and transmits the signal 132 to the second signal path 112, e.g., such that the mixer 114 and the programmable filter circuit 116 can alter the frequency fi of the signal 132 and generate a filtered signal 142.

As described above, in an example, the system 100 comprises another switch 120 comprising two input terminals 113a and 113b, and one output terminal 113c. A first input terminal 113a of the switch 120 is coupled to the output terminal 109a of the switch 108, via the signal path 110. As illustrated, there is no component within the signal path 110 that can substantially alter a frequency of the signal 132 being transmitted through the signal path 110. Thus, if the switch 108 supplies the amplified input signal 132 to the signal path 110, the same amplified input signal 132 is received by the input terminal 113a of the switch 120, without any significant change to its frequency.

Another input terminal 113b of the switch 120 is coupled to an output of the signal path 112. Thus, the signal path 112 is coupled between the output terminal 109b of the switch 108 and the input terminal 113b of the switch 120. As illustrated, the signal path 112 comprises a plurality of active components that can alter the frequency of the amplified input signal 132, and generate a filtered signal 142 (also referred to herein simply as signal 142).

Now referring to the signal path 112, the signal path 112 comprises a mixer 114 coupled to the output terminal 109b of the switch 108. Based on a state of the switch 108 (e.g., which is controlled by the control signal 150b), the signal 132 is transmitted to either the signal path 110, or to the mixer 114 of the signal path 112.

The mixer 114 selectively receives the signal 132 (e.g., based on the state of the switch 108), and also receives another input signal 138 from an oscillator circuit 112. The oscillator circuit 112 comprises a local oscillator (LO), or another appropriate type of oscillator circuit, which generates the signal 138 at a frequency that is controlled by a control signal 150c. In an example, the controller 128 generates the control signal 150c, e.g., based on the configuration data 127. The control signal 150c in turn controls the oscillator circuit 112 to generate the signal 138 at a specific frequency fc configured by the control signal 150c. In an example, a user of the system 100 can tune the frequency fc of the signal 138, e.g., by appropriately programming the configuration data 127. The frequency fc of the signal 138 affects the frequency fo of the signals 142 and 146, and the frequency fc of the signal 138 can be controlled to achieve a desired frequency fo at an output of the system 100. In an example where the system 100 is used to generate a RF output, the oscillator circuit 112 generates the signal 138 at an appropriate radio frequency, e.g., in the range of 100 KHz-300 GHz. The oscillator circuit 112 comprises any appropriate components included in an oscillator circuit.

The mixer 114, such as a frequency mixer, receives the signals 132 and 138, and performs a frequency mixing of the two signals 132 and 128, to generate a modified input signal 140 (also referred to herein as signal 140). In an example, the mixer 114 is a heterodyne mixer, where the signal 140 generated by the mixer 114 comprises components including a sum of the frequencies of the signals 132 and 138, as well as a difference of the frequencies of the signals 132 and 138. Thus, merely as an example, the signals 130 and 132 may be at a frequency fi of 2.4 GHz, the signal 138 may be generated at a frequency fc of 10 GHz by the oscillator 112, and the signal 140 output by the mixer may comprise a component having a difference frequency of |fi−fc|=(10−2.4)=7.6 GHz, and the signal 140 may also comprise a component having a sum frequency of (fi+fc)=(10+2.4)=12.4 GHz. In some examples, in addition to the sum and difference of the frequencies of the signals 132 and 138, the signal 140 may also include some other frequencies, such as harmonics of the sum and difference frequencies.

In one embodiment, the system 100 comprises a programmable filter circuit 116 (also referred to herein as a filter circuit 116, or simply as circuit 116) configured to receive the signal 140 that comprises frequencies (fc−fi) and (fc+fi). The circuit 116 may be configured to implement an appropriate type of filter, such as a high-pass filter, a low-pass filter, a band pass filter, or another appropriate type of filter.

In an example, the circuit 116 acts as a band pass filter that passes frequencies within a certain frequency range, and rejects or attenuates frequencies outside the range.

In one embodiment, the passband of the bandpass filter circuit 116 is controlled by a control signal 150d that is generated by the controller 128. Continuing with the above example where the signal 140 comprises a difference frequency of (fc−fi) and a sum frequency of (fc+fi), it may be intended that the filter circuit 116 attenuate one of the difference frequency or sum frequency, and pass the other of the difference frequency or sum frequency. The passband of the filter circuit 116 may be appropriately set by the control signal 150d generated by the controller 128. Note that the frequencies fi and/or fc may be tuned or controlled by a user, e.g., by controlling the oscillator 112 through the controller 128, and/or by controlling generation of the input signal 130 at frequency f1. The passband of the filter circuit 116 may also have to be correspondingly tuned by the controller 128.

Figure 2:
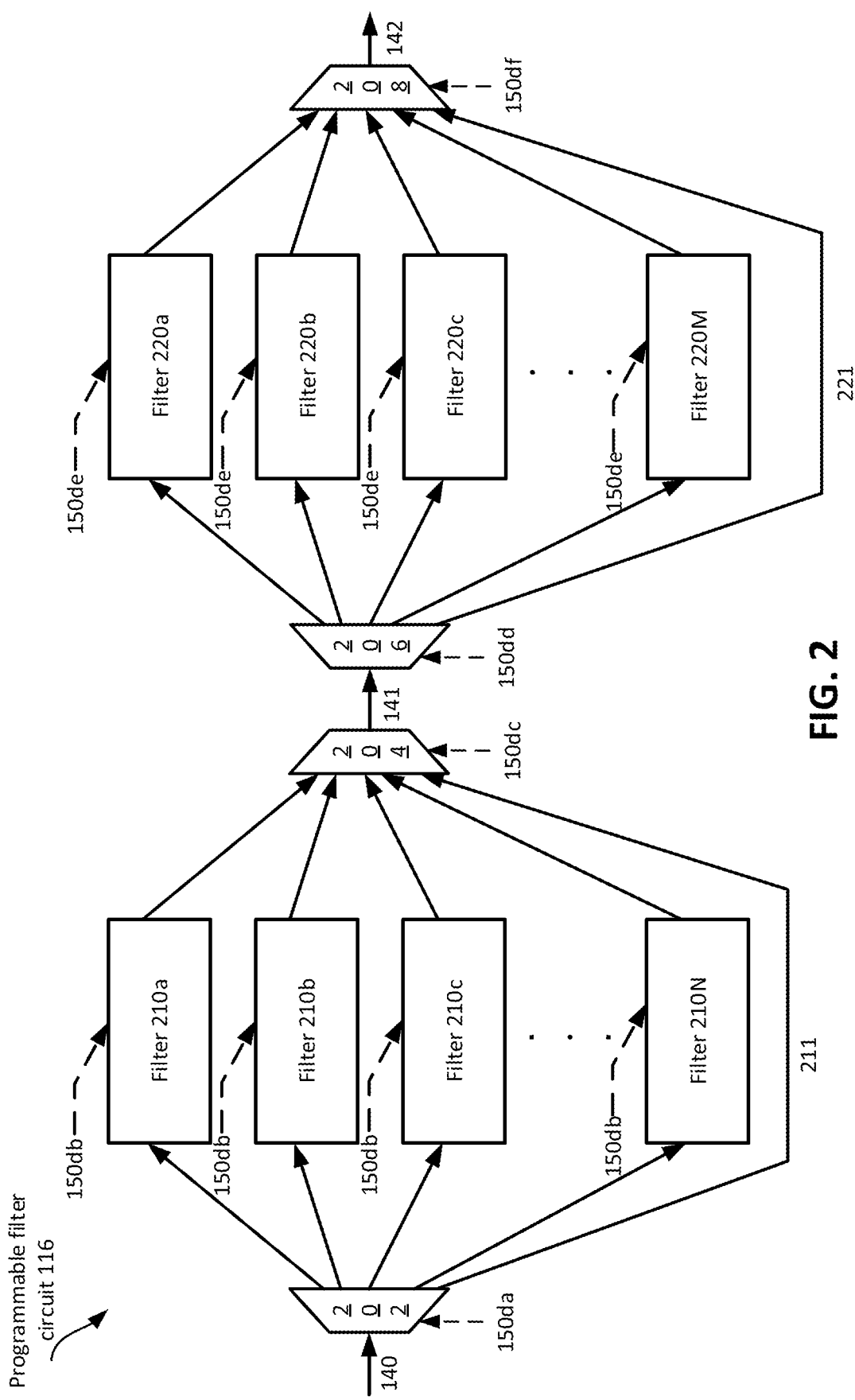
FIG. 2 illustrates an example implementation of a programmable filter circuit of the frequency converter system of FIG. 1, according to an embodiment of the present disclosure.

FIG. 2 illustrates an example implementation of a programmable filter circuit 116 of the frequency converter system 100 of FIG. 1, according to an embodiment of the present disclosure. As illustrated in FIG. 2, the programmable filter circuit 116 comprises a plurality of high-pass filters 210a, . . . , 210N, and a plurality of low-pass filters 220a, . . . , 220M. Thus, there are N number of high-pass filters 210 and M number of low-pass filters 220, where N and M are appropriate integers greater than one. In an example, N and M may be same, although they may be different in another example. The numbers N and M are implementation specific, and may depend on a desired resolution of the filter circuit 116. In an example, each of N and M may be four, or eight, or sixteen, or another appropriate integer.

Note that in FIG. 1, control signal 150d is illustrated to be generated by the controller 128 and transmitted to the filter circuit 116. As illustrated in FIG. 2, the control signal 150d may be a collection of a plurality of control signals 150da, 150db, 150dc, 150dd, 150de, and 150df. In an example, the controller 128 transmits the control signals 150da, 150db, 150dc, 150dd, 150de, and 150df in series, or in parallel, to the filter circuit 116.

In an example, some of the control signals 150da, 150db, 150dc, 150dd, 150de, and 150df can be combined. For example, control signals 150da and 150dc can be combined into a single control signal, and similarly, control signals 150dd and 150df can be combined into a single control signal, as will be described herein below.

In an example, each of the high-pass filters 210a, . . . , 210N may be tuned or programmed independently (e.g., independent of tuning the low-pass filters), e.g., using the control signal 150db, as will be described in further detail below. Similarly, each of the low-pass filters 220a, . . . , 220M may be tuned or programmed independently (e.g., independent of tuning the high-pass filters), e.g., using the control signal 150de. As each of the filters 210a, . . . , 210N, 220a, . . . , 220M can be programmed or tuned, the high-pass filters 210a, . . . , 210N are also referred to herein as programmable high-pass filters, and the low-pass filters 220a, . . . , 220N are also referred to herein as programmable low-pass filters.

In one embodiment, the filter circuit 116 comprises a demultiplexer 202 receiving the signal 140 from the mixer 114. The demultiplexer 202 comprises a plurality of output terminals, each output terminal of the demultiplexer 202 coupled to an input of a corresponding high-pass filter 210, as illustrated. For example, a first output terminal of the demultiplexer 202 is coupled to an input of the high-pass filter 210*a*, a second output terminal of the demultiplexer 202 is coupled to an input of the high-pass filter 210*b*, an N<sup>th</sup> output terminal of the demultiplexer 202 is coupled to an input of the high-pass filter 210N, and so on.

In an embodiment, the demultiplexer 202 is controlled by a control signal 150*da* generated by the controller 128. Based on the control signal 150*da*, the demultiplexer 202 transmits the signal 140 from its input to a selected one of the filters 210*a*, . . . , 210N. Thus, the control signal 150*da* is a filter selection control signal, which selects one of the filters 210*a*, . . . , 210N that is to receive and process the signal 140.

In one embodiment, the filter circuit 116 further comprises a multiplexer 204 receiving an output from each of the high-pass filters 210*a*, . . . , 210N, and outputting a signal from a selected one of the high-pass filters 210*a*, . . . , 210N as an intermediate signal 141 (also referred herein simply as signal 141). In an example, the multiplexer 204 is controlled by a control signal 150*dc*, which also acts as a filter selection signal.

In an example, the demultiplexer 202 controlled by the control signal 150*da* and the multiplexer 204 controlled by the control signal 150*dc* work in tandem or synchronously. For example, if the control signal 150*da* of the demultiplexer 202 selects a specific filter 210*i* (where i is any one of a, . . . , N), then the control signal 150*dc* of the multiplexer 204 also selects the specific filter 210*i*. Merely as an example, assuming 210*i* is 210*b*, the demultiplexer 202 transmits the signal 140 to the filter 210*b*, and the multiplexer 204 outputs the signal 141 that is the output of the same filter 210*b*. Thus, in this example, both the control signals 150*da* and 150*dc* refer to a single filter 210*b*. Accordingly, in an example, a single control signal can replace the control signals 150*da* and 150*dc*, where the single control signal is supplied to both the demultiplexer 202 and multiplexer 204.

In an example, in addition to the high-pass filters 210*a*, . . . , 210N, there is a bypass line 211 between the demultiplexer 202 and the multiplexer 204. For example, if it is desired that the signal 140 be not processed by a high-pass filter, then the signal 140 is transmitted by the demultiplexer 202 to the multiplexer 204 via the bypass line 211, thereby bypassing the high-pass filters 210*a*, . . . , 210N.

Thus, the high-pass filters 210*a*, . . . , 210N and the bypass line 211 are arranged in parallel. At a given time (e.g., based on the various control signals), only one of a single selected high-pass filter or the bypass line 211 is active, where active implies that the demultiplexer 202 transmits the signal 140 to the active (e.g., selected) high-pass filter 210 or the bypass line 211, and the multiplexer 204 receives an output signal 141 from the active (e.g., selected) high-pass filter 210 or the bypass line 211.

In one embodiment, the filter circuit 116 further comprises a second demultiplexer 206. The demultiplexer 206 receives the signal 141 from the multiplexer 204. The demultiplexer 206 comprises a plurality of output terminals, each output terminal of the demultiplexer 206 coupled to an input of a corresponding low-pass filter 220, as illustrated in FIG. 2. For example, a first output terminal of the demultiplexer 206 is coupled to an input of the low-pass filter 220*a*, a second output terminal of the demultiplexer 206 is coupled to an input of the low-pass filter 220*b*, an M<sup>th</sup> output terminal of the demultiplexer 206 is coupled to an input of the low-pass filter 220M, and so on.

In an embodiment, the demultiplexer 206 is controlled by the control signal 150*dd* generated by the controller 128. Based on the control signal 150*dd*, the demultiplexer 206 transmits the signal 141 from its input to a selected one of the filters 220*a*, . . . , 220M. Thus, the control signal 150*dd* is a filter selection control signal, which selects one of the filters 220*a*, . . . , 220M that is to receive and process the signal 141.

In one embodiment, the filter circuit 116 further comprises a second multiplexer 208 receiving an output from each of the low-pass filters 220*a*, . . . , 220M, and outputting signal from a selected one of the low-pass filters 220*a*, . . . , 220N as a filtered signal 142 (also referred to herein as signal 142). In an example, the multiplexer 208 is controlled by a control signal 150*df*, which also acts as a filter selection signal.

In an example, the demultiplexer 206 controlled by the control signal 150*dd* and the multiplexer 208 controlled by the control signal 150*df* work in tandem or synchronously. For example, if the control signal 150*dd* of the demultiplexer 206 selects a specific filter 220*j* (where j is any one of a, . . . , M), then the control signal 150*df* of the multiplexer 208 also selects the specific filter 220*j*. Merely as an example, assuming 220*j* is 220*c*, the demultiplexer 206 transmits the signal 141 to the filter 220*c*, and the multiplexer 208 output the signal 142 that is the output of the same filter 210*c*. Thus, in this example, both the control signals 150*dd* and 150*df* refer to a same filter 210*c*. Accordingly, in an example, a single control signal can replace the control signals 150*dd* and 150*df*, where the single control signal is supplied to both the demultiplexer 206 and multiplexer 208.

In an example, in addition to the low-pass filters 220*a*, . . . , 220M, there is a bypass line 221 between the demultiplexer 206 and the multiplexer 208. For example, if it is desired that the signal 141 be not processed by a low-pass filter, the signal 141 is transmitted by the demultiplexer 206 to the multiplexer 208 via the bypass line 221, thereby bypassing the low-pass filters 220*a*, . . . , 220N.

Thus, the low-pass filters 220*a*, . . . , 220M and the bypass line 221 are in parallel. At a given time (e.g., based on the various control signals), only one of a single selected low-pass filter or the bypass line 221 is active, where active implies that the demultiplexer 206 transmits the signal 141 to the active (e.g., selected) low-pass filter 220 or the bypass line 221, and the multiplexer 208 receives and outputs processed signal 142 from the active (e.g., selected) low-pass filter 220 or the bypass line 221.

Note that in FIG. 2, the bank of high-pass filters 210 are placed before the bank of low-pass filters 220. However, this order may be reversed, such that the bank of low-pass filters 220 are placed prior to the bank of high-pass filters 210.

FIG. 3 illustrate a graph 300 depicting filter characteristics of example states of operation S0, . . . , S3 of example high-pass filters 210*a*, 210*b*, 210*c* of the programmable filter circuit 116 of FIGS. 1 and 2, according to an embodiment of the present disclosure. The X-axis of the graph 300 depicts frequency, and the Y-axis of the graph 300 depicts filter gain (e.g., in dB). The filter characteristics of the high-pass filter 210*a* are illustrated using solid lines, the filter characteristics of the high-pass filter 210*b* are illustrated using dotted lines, and the filter characteristics of the high-pass filter 210*c* are illustrated using dashed lines. Although filter characteristics of only three of the high-pass filters 210*a*, . . . , 210N are illustrated, filter characteristics of other high-pass filters can also be similarly graphed.

In one embodiment, each of the high-pass filters 210*a*, . . . , 210N is assumed to have a specific number of states of operation, such as states 0, 1, . . . , (P−1), where P is an integer. In the example of FIG. 3, P is assumed to be 4, e.g., there are three states S0, S1, S2, and S3 of operation for each high-pass filter 210. In another example, there may be 8 states, or 16 states, or 32 states for each filter. In an example, a number of states for each filter is implementation specific, and may be based on a desired resolution by which the filtering can be done by the filter bank comprising the high-pass filters 210a, . . . , 210N.

At any given time, a specific one of the high-pass filters can operate at a specific one of the four possible states S0, . . . , S3, where the specific one of the high-pass filters may be selected by the control signals 150da and/or 150dc, and where the specific one of the possible states of operation may be selected by another control signal 150db. Thus, a given high-pass filter can be tuned or programmed to any one of P number of states, where P=4 in the example of FIG. 3.

Each line in FIG. 3 is labelled with a corresponding state (e.g., one of S0, . . . , S3) of operation and a corresponding high-pass filter. Thus, a line labelled with S0, 210a implies that the line represents filter characteristics of the high-pass filter 210a operating at state S0 of operation.

As illustrated in FIG. 3, each state of a high-pass filter 210 is associated with a corresponding pass band and a corresponding cut off frequency. An example passband and a corresponding cut off frequency of state S3 of the high-pass filter 210c is labelled in FIG. 3, and other states of other filters also have corresponding passbands and cutoff frequencies. Accordingly, individual state of individual filter has a corresponding gain-frequency plot. Thus, if state S0 of high-pass filter 210a is selected (e.g., by the various control signals discussed herein), then a corresponding first cutoff frequency and a corresponding first passband is achieved by the filter bank comprising the high-pass filters; if state S1 of high-pass filter 210a is selected, then a corresponding second cutoff frequency and a corresponding second passband is achieved by the filter bank comprising the high-pass filters; if state S2 of high-pass filter 210a is selected, then a corresponding third cutoff frequency and a corresponding third passband is achieved by the filter bank comprising the high-pass filters; and so on.

Thus, for N number of high-pass filters 210a, . . . , 210N and P number of states for each filter, there may be (N×P) number of possible passbands and corresponding cutoff frequencies that is achievable by the filter bank comprising the high-pass filters 210a, . . . , 210N. The controller 128, based on the configuration data 127, selects one of the (N×P) number of possible passbands and corresponding cutoff frequencies, e.g., by selecting a specific filter (e.g., using the control signals 150da and/or 150dc) and a specific state of operation of the selected filter (e.g., using the control signal 150db), to achieve the target passband and the corresponding target cutoff frequency. In an example, if the configuration data 127 indicates that no high-pass filtering of the signal 140 is desired, then the bypass line 211 may be activated by appropriately configuring the control signals 150da and/or 150dc.

FIG. 4 illustrate a graph 400 depicting filter characteristics of example states of operation S0, . . . , S3 of example low-pass filters 220a, 220b, 220c of the programmable filter circuit 116 of FIGS. 1 and 2, according to an embodiment of the present disclosure. The X-axis of the graph 400 depicts frequency, and the Y-axis of the graph 400 depicts filter gain (e.g., in dB). The filter characteristics of the low-pass filter 220a are illustrated using dashed lines, the filter characteristics of the low-pass filter 220b are illustrated using dotted lines, and the filter characteristics of the low-pass filter 220c are illustrated using solid lines. Although filter characteristics of only three of the low-pass filters 220a, . . . , 220M are illustrated, filter characteristics of other low-pass filters can also be similarly graphed.

In one embodiment, each of the low-pass filters 220a, . . . , 220M is assumed to have a specific number of states of operation, such as states 0, 1, . . . , (Q−1), where Q is an integer. Note that the number P of states of operation of individual high-pass filters 210 and the number Q of states of operation of individual low-pass filters 220 can be same or different (e.g., P and Q can be same or different). In an example, P and Q are same, e.g., each high-pass and low-pass filter has a same number of states of operation.

In the example of FIG. 3, Q is assumed to be 4, e.g., there are three states S0, S1, S2, and S3 of operation for each low-pass filter 220. In another example, there may be 8 states, or 16 states, or 32 states for each filter. In an example, a number of states for each filter is implementation specific, and may be based on a desired resolution by which the filtering can be done by the filter bank comprising the low-pass filters 220a, . . . , 220M. Thus, at any given time, a specific selected one of the low-pass filters can operate at a specific selected one of the four possible states S0, . . . , S3, where the specific one of the high-pass filters may be selected by the control signals 150dd and/or 150df, and where the specific one of the possible states may be selected by another control signal 150de. Thus, a given low-pass filter can be tuned or programmed to any one of Q number of states, where Q=4 in the example of FIG. 4.

Each line in FIG. 4 is labelled with a corresponding state (e.g., one of S0, . . . , S3) of operation and a corresponding low-pass filter. Thus, a line labelled with S0, 220a implies that the line represents filter characteristics of the low-pass filter 220a operating at state S0 of operation.

As illustrated in FIG. 4, each state of a low-pass filter 220 is associated with a corresponding pass band and a corresponding cut off frequency. An example passband and a corresponding cut off frequency of state S0 of the low-pass filter 220a is labelled in FIG. 3, and other states of other filters also have corresponding passbands and cutoff frequencies. Accordingly, individual state of individual filter has corresponding gain-frequency plot. Thus, if state S0 of low-pass filter 210a is selected (e.g., by the various control signals discussed herein), then a corresponding first cutoff frequency and a corresponding first passband is achieved by the filter bank comprising the low-pass filters; if state S1 of low-pass filter 220a is selected, then a corresponding second cutoff frequency and a corresponding second passband is achieved by the filter bank comprising the low-pass filters; if state S2 of low-pass filter 220a is selected, then a corresponding third cutoff frequency and a corresponding third passband is achieved by the filter bank comprising the low-pass filters; and so on.

Thus, for M number of low-pass filters 220a, . . . , 220M and Q number of states for each low-pass filter, there may be (M×Q) number of possible passbands and corresponding cutoff frequencies that is achievable by the filter bank comprising the low-pass filters 220a, . . . , 220M. The controller 128, based on the configuration data 127, selects one of the (M×Q) number of possible passbands and corresponding cutoff frequencies, e.g., by selecting a specific filter (e.g., using the control signals 150dd and/or 150df) and a specific state of the filter (e.g., using the control signal 150de), to achieve the target passband and the corresponding selected cutoff frequency. In an example, if the configuration data 127 indicates that no low-pass filtering of the signal 140 is desired, then the bypass line 221 may be activated by appropriately configuring the control signals 150*dd* and/or 150*df*.

FIG. 5 illustrate a graph 500 depicting filter characteristics during an example operation of the filter circuit 116 of FIG. 2, according to an embodiment of the present disclosure. In the example of FIG. 5, it is assumed that the high-pass filter 210*a* is selected (e.g., by the control signals 150*da* and/or 150*dc*) among the high-pass filters 210*a*, . . . , 210N, and a state S2 of the high-pass filter 210*a* is selected (e.g., by the control signal 150*db*). Furthermore, it is assumed that the low-pass filter 220*c* is selected (e.g., by the control signals 150*dd* and/or 150*df*) among the low-pass filters 220*a*, . . . , 220M, and a state S1 of the low-pass filter 220*c* is selected (e.g., by the control signal 150*de*). Accordingly, the high-pass filter 210*a* at state S2 operates on the signal 140, to generate the signal 141. Subsequently, the low-pass filter 220*c* at state S1 operates on the signal 141, to generate the signal 142, where the signal 142 is output by the filter circuit 116. Accordingly, the high-pass filter 210*a* (at state S2) and the low-pass filter 220*c* (at state S2), in combination, acts as a band pass filter, as depicted in FIG. 5.

For example, a lower cutoff frequency of f1 and an upper cutoff frequency of f2 is achieved by the filter circuit 116, as illustrated in FIG. 5. Note that the low cutoff frequency f1 can be tuned, e.g., by selecting an appropriate one of the high-pass filters 210*a*, . . . , 210N and an appropriate one of the states S0, . . . , S(P−1). Similarly, the high cutoff frequency f2 can be tuned, e.g., by selecting an appropriate one of the low-pass filters 220*a*, . . . , 220M and an appropriate one of the states S0, . . . , S(Q−1).

In an example and as previously discussed herein, the signal 140 may comprise a difference frequency of |fi−fc| and a sum frequency of (fi+fc), and it may be intended that the filter circuit 116 attenuates one of the difference frequency or sum frequency, and passes the other of the difference frequency or sum frequency. In an example, the frequencies f1 and f2 are tuned or selected such that the filter circuit 116 attenuates an undesired one of the difference frequency or sum frequency, and passes the target one of the difference frequency or sum frequency.

Referring again to FIG. 1, as previously described herein, the system 100 comprises another switch 120 comprising two input terminals 113*a* and 113*b*, and one output terminal 113*c*. A first input terminal 113*a* of the switch 120 is coupled to the output terminal 109*a* of the switch 108, via the signal path 110. Another input terminal 113*b* of the switch 120 is coupled to the output 142 of the filter circuit 116. An output terminal 113*c* of the switch 120 is coupled to either the input terminal 113*a* or the input terminal 113*b*, e.g., based on a state of the switch 120 that is controlled by the control signal 150*e*. The switch 120 outputs an output signal 144 (also referred to herein as signal 144), which is either (i) the signal 132 (e.g., if the output terminal 113*c* is coupled to the input terminal 113*a*), or (ii) the signal 142 (e.g., if the output terminal 113*c* is coupled to the input terminal 113*b*).

There is no component within the signal path 110 that can substantially alter a frequency of the signal 132 being transmitted through the signal path 110. In contrast, the signal path 112 comprises the mixer 114 and the filter circuit 116 that can alter the frequency of the amplified input signal 132, and generate a filtered signal 142.

In an example, the control signal 150*b* controlling the state of switch 108 and the control signal 150*e* controlling the state of switch 120 work in tandem (e.g., is synchronized), and in an example, a single control signal can be used to control both switches 108 and 120. Thus, if the controller 128 desires no change in the frequency of the signal 130 (e.g., the frequencies of the signals 130 and 144 are to be the same), then (i) the control signal 150*b* causes the input terminal 109*c* of the switch 108 to be coupled to the output terminal 109*a*, and (ii) the control signal 150*e* causes the input terminal 113*a* of the switch 120 to be coupled to the output terminal 113*c*. In this scenario, the signal 132 is transmitted via the signal path 110, and no frequency alteration of the signal 132 occurs.

On the other hand, if the controller 128 desires a change in the frequency of the signal 130 (e.g., the frequencies of the signals 130 and 144 are to be different), then (i) the control signal 150*b* causes the input terminal 109*c* of the switch 108 to be coupled to the output terminal 109*b*, and (ii) the control signal 150*e* causes the input terminal 113*b* of the switch 120 to be coupled to the output terminal 113*c*. In this scenario, the signal 132 is transmitted via the signal path 112, and the frequency the signal 132 is changed by the mixer 114 and the filter circuit 116.

In one embodiment, the system 100 further comprises an output amplification and attenuation circuit 124 configured to receive the signal 144, and generate an amplified output signal 146 (also referred to herein as signal 146). The amplification and attenuation circuit 124 amplifies and/or attenuates the signal 144, to generate the signal 146 having the frequency fo. Note that if signal path 110 is used, then the output frequency fo and the input frequency fi are the same. On the other hand, if the signal path 112 is used, then the output frequency fo and the input frequency fi are different, and the output frequency fo is based on operations of the mixer 114 and the filter circuit 116.

The amplification and attenuation circuit 124 may comprise one or more signal amplifiers and/or one or more signal attenuators, which alter an amplitude of the signal 144, e.g., without altering a frequency of the signal 144, based on a gain of the amplification and attenuation circuit 124. In one embodiment, an operation of the amplification and attenuation circuit 124 may be based on a temperature of the amplification and attenuation circuit 124, and/or a target gain of the amplification and attenuation circuit 124. For example, a change in temperature may affect a gain of the amplification and attenuation circuit 124. Accordingly, in some embodiments, the amplification and attenuation circuit 124 may receive a control signal 150*f* from the controller 128, which may be used to fine tune the amplification and attenuation circuit 124, to eliminate or at least reduce effects of temperature on an operation of the amplification and attenuation circuit 124. For example, based on the temperature measurement data 125, the controller 128 may generate the control signal 150*f*, to reduce or eliminate effects of temperature on the operation of the amplification and attenuation circuit 124. In an example, the control signal 150*f* may also be used to control and achieve a target gain of the amplification and attenuation circuit 124.

As described above, the N number of high-pass filters 210*a*, . . . , 210N has (N×P) possible states of operation and corresponding (N×P) possible passbands of operation. Similarly, the M number of low-pass filters 220*a*, . . . , 220M has (M×Q) possible states of operation and corresponding (M×Q) possible passbands of operation. Because of such large number of states of operations and corresponding large possible passbands of operation, the filter circuit 116 can handle a relatively wide range of frequencies. Accordingly, the filter circuit 116 can operate as a wideband filter circuit, and the system 100 is a wideband frequency converter system.

Note that the system 100 can operate as a frequency upconverter (such as a wideband frequency upconverter), e.g., where the difference frequency of |fi−fc| is attenuated or filtered out, and the sum frequency of (fi+fc) is passed by the filter circuit 116. Thus, the input signal 130 has a frequency of fi, and the output signal 146 has the frequency of fo, where fo is this case is the sum frequency of (fi+fc). Thus, the increase in the frequency is fc output by the oscillator 112, where the frequency fc can be controlled or tuned by the controller 128, e.g., using the control signal 150c. In another example, the difference frequency (fc−fi) may be higher than the frequency fi, and the system 100 can still operate as an upconverter, e.g., by passing the difference frequency (fc−fi) and attenuating the sum frequency (fc+fi).

However, in another example, the system 100 can operate as a frequency downconverter (such as a wideband frequency downconverter), e.g., where the difference frequency of |fi−fc| is passed on by the filter circuit 116, and the sum frequency of (fi+fc) is attenuated or filtered out by the filter circuit 116. Thus, the input signal 130 has a frequency of fi, and the output signal 146 has the frequency of fo, where fo is this case is the difference frequency of |fi−fc|. Thus, the decrease in the frequency is fc output by the oscillator 112, where the frequency fc can be controlled or tuned by the controller 128, e.g., using the control signal 150c.

Thus, the system 100 can be configured to be used as a frequency upconverter or a frequency downconverter, in an example, e.g., by appropriately selecting the frequency fc of the signal 138, and/or by appropriately selecting the passband of the filter circuit 116.

Figure 6:
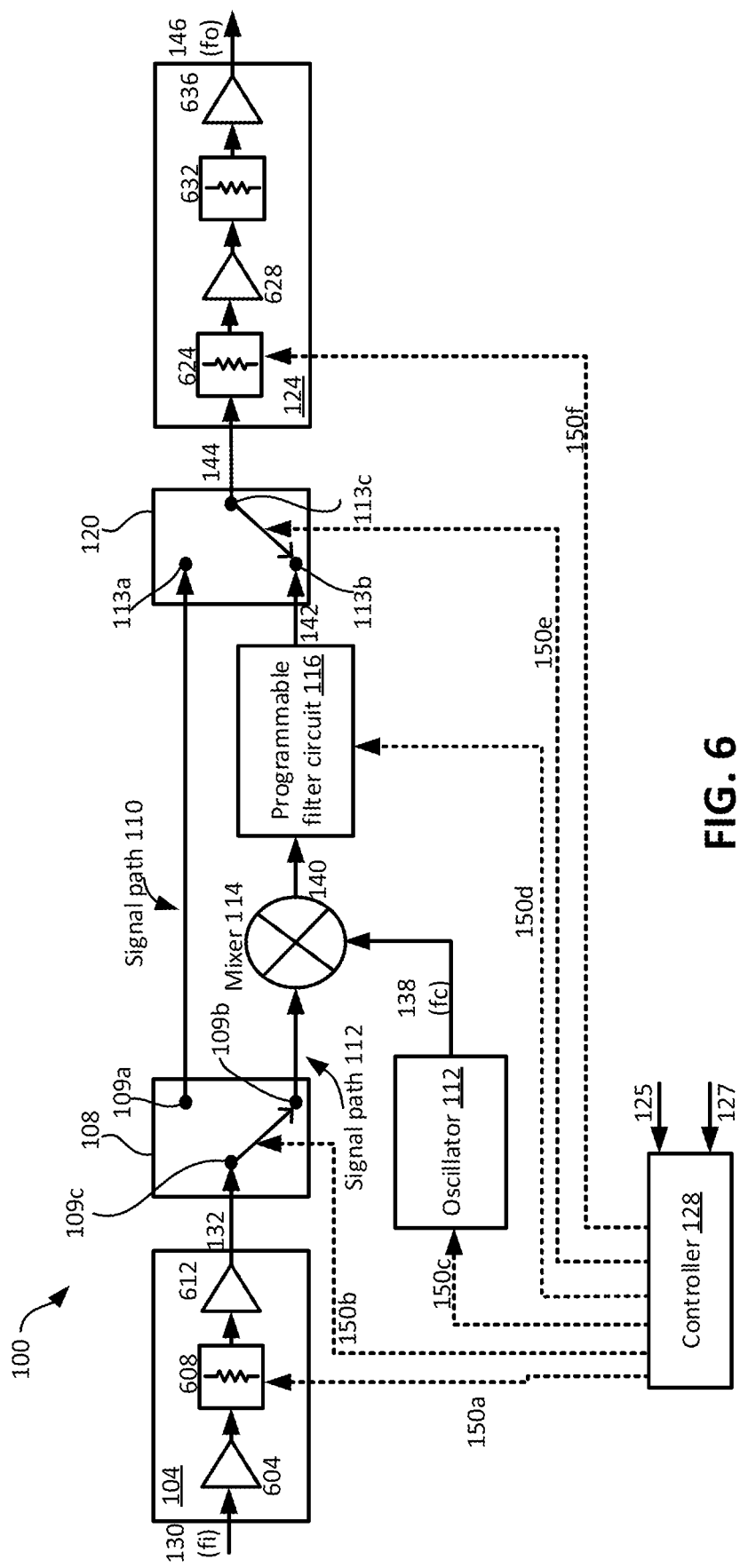
FIG. 6 illustrates example implementations of an input amplification and attenuation circuit and an output amplification and attenuation circuit of a frequency converter system, according to an embodiment of the present disclosure.

FIG. 6 illustrates example implementations of an input amplification and attenuation circuit 104 and an output amplification and attenuation circuit 124 of the frequency converter system 100 of FIG. 1, according to an embodiment of the present disclosure. In the example of FIG. 6, the amplification and attenuation circuit 104 comprises an amplifier 604 receiving the input signal 130, and amplifying the signal 130. An output of the amplifier 604 is received by an attenuator 608, which attenuates the output of the amplifier 604. An output of the attenuator 608 is received by another amplifier 612, which amplifies the output of the attenuator 608, and generates the amplified signal 132.

In an example, the amplifiers 604 and 612 are any appropriate type of amplifiers, such as low noise amplifiers (LNA) in one example. As illustrated in FIG. 6, in one embodiment, an attenuation factor of the attenuator 608 is controlled by the controller 128, via the control signal 150a, e.g., in order to control the gain of the amplification and attenuation circuit 104 and/or in order to eliminate or at least reduce effects of temperature variation of components of the amplification and attenuation circuit 104. For example, the controller 128 receives the temperature measurement data 125, and the generates the control signal 150a to eliminate or at least reduce effects of temperature variation.

Although not illustrated in FIG. 6, in an example one or both the amplifiers 604 and 612 may be variable gain amplifiers (VGA), where the gain of the VGA is controlled by the control signal 150a, e.g., in order to control the gain of the amplification and attenuation circuit 104 and/or in order to eliminate or at least reduce effects of temperature variation of components of the amplification and attenuation circuit 104. For example, the controller 128 receives the temperature measurement data 125, and the generates the control signal 150a to eliminate or at least reduce effects of temperature variation. Although FIG. 6 illustrates two amplifiers 604 and 612 and the attenuator 608 included in the amplification and attenuation circuit 104, any other combination of amplifiers and/or attenuators may be included in the amplification and attenuation circuit 104 in other examples.

In the example of FIG. 6, the output amplification and attenuation circuit 124 comprises an attenuator 624 receiving the output signal 144, and attenuating the signal 144. An output of the attenuator 624 is received by an amplifier 628 that amplifies the signal. An output of the amplifier 628 is received by another attenuator 632, which attenuates the signal. An output of the attenuator 632 is received by an amplifier 636 that amplifies the signal and generates an amplified output signal 636.

In an example, the amplifiers 628 and 636 are any appropriate type of amplifiers, such as LNAs in one example. As illustrated in FIG. 6, in one embodiment, an attenuation factor of the attenuator 624 is controlled by the controller 128, via the control signal 150f, e.g., in order to control the gain of the amplification and attenuation circuit 124 and/or in order to eliminate or at least reduce effects of temperature variation of components of the amplification and attenuation circuit 124. For example, the controller 128 receives the temperature measurement data 125, and the generates the control signal 150f to eliminate or at least reduce effects of temperature variation.

Although not illustrated in FIG. 6, in an example one or both the amplifiers 628 and 636 may be VGAs, where the gain of a VGA is controlled by the control signal 150f, e.g., in order to control the gain of the amplification and attenuation circuit 124 and/or in order to eliminate or at least reduce effects of temperature variation of components of the amplification and attenuation circuit 124. Similarly, in an example, in addition to, or instead of the attenuator 624, the attenuator 632 may be controlled by the controller 128, e.g., via the control signal 150f. Although FIG. 6 illustrates two amplifiers 628 and 636 and two attenuators 624 and 632 included in the amplification and attenuation circuit 124, any other combination of amplifiers and/or attenuators may be included in the amplification and attenuation circuit 124 in other examples.

Figure 7:
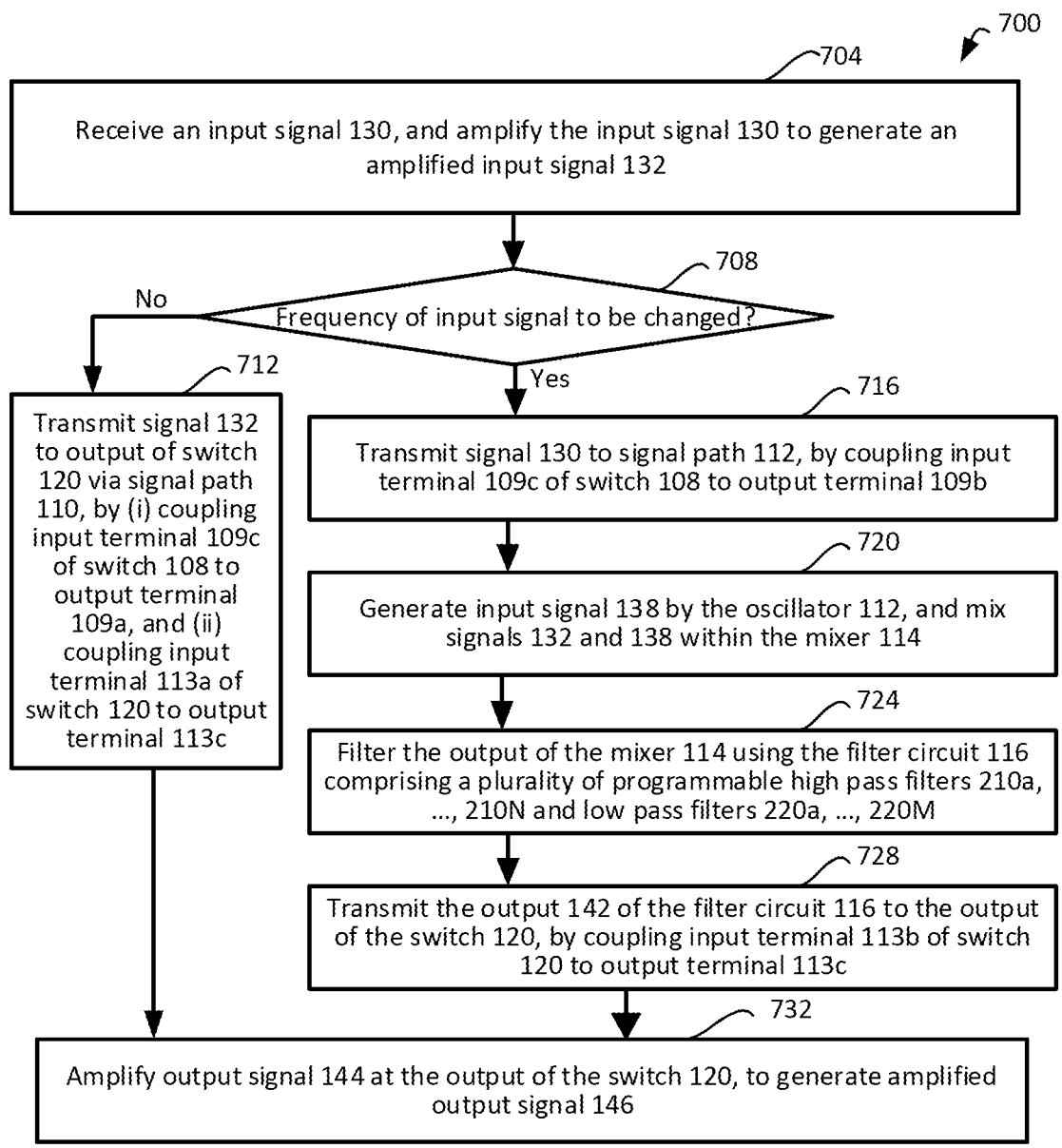
FIG. 7 illustrates a flowchart depicting an example method of operation of a frequency converter system, according to an embodiment of the present disclosure.

FIG. 7 illustrates a flowchart depicting an example method 700 of operation of the frequency converter system 100 of FIGS. 1-6, according to an embodiment of the present disclosure.

Referring to FIGS. 1 and 7, the method 700 includes, at 704, receiving an input signal 130, and amplifying the input signal 130 (e.g., by the amplification and attenuation circuit 104) to generate an amplified input signal 132. The method 700 then proceeds from 704 to 708, where a determination is made as to whether a frequency of the input signal 130 is to be changed. In an example, the determination is made by the controller 128, e.g., based on the configuration data 127 received by the controller 128.

If "No" at 708 (e.g., frequency of the input signal 130 is not to be changed), then the method 700 proceeds from 708 to 712, where the amplified input signal 132 is transmitted to an output terminal 113c of the switch 120 via signal path 110. Because the signal path 110 doesn't have any component that can alter a frequency of the transmitted signal, the signal 144 and the input signal 130 has the same frequency. In an example, the transmission at 712 is caused by the controller 128, e.g., by (i) coupling the input terminal 109c of switch 108 to the output terminal 109a (e.g., using the control signal 150b), and (ii) coupling the input terminal 113a of the switch 120 to the output terminal 113c (e.g., using the control signal 150e).

On the other hand, if "Yes" at 708 (e.g., frequency of the input signal 130 is to be changed), then the method 700 proceeds from 708 to 716, where the amplified input signal 132 is transmitted to the signal path 112. The transmission at 716 is caused by the controller 128, e.g., by coupling the input terminal 109*c* of the switch 108 to the output terminal 109*b* (e.g., using the control signal 150*b*).

The method 700 then proceeds from 716 to 720, where another input signal is generated (e.g., by an oscillator 112), and the signals 132 and 138 are mixed (e.g., within the mixer 114, which may be a heterodyne mixer in an example). Mixing the signals 132 and 138 generates a modified input signal 140, which includes a sum of the frequencies of the signals 132 and 138, as well as a difference of the frequencies of the signals 132 and 138 (e.g., if the mixer 114 is a heterodyne mixer), in an example.

The method 700 then proceeds from 720 to 724, where the output of the mixer 114 is filtered using the filter circuit 116 comprising a plurality of programmable high-pass filters 210*a*, . . . , 210N and low-pass filters 220*a*, . . . , 220M. Example operations of the filter circuit 116 have been discussed herein above with respect to FIGS. 2-5.

The method 700 then proceeds from 724 to 728, where an output 142 of the filter circuit 116 is transmitted to the output of the switch 120. For example, the controller 128 causes (e.g., using the control signal 150*e*) the input terminal 113*b* of switch 120 to be coupled to the output terminal 113*c*, thereby facilitating the transmission of 728.

The method 700 then proceeds from 712 or 728 to 732. For example, at 712 the output 144 of the switch 120 is the signal 132 from the signal path 110, whereas at 728 the output 144 of the switch 120 is the signal 142 from the signal path 112. At 732, the output signal 144 at the output of the switch 120 is amplified (e.g., by the amplification and attenuation circuit 124), to generate amplified output signal 146 of the system 100.

Note that the processes in method 700 are shown in a particular order for ease of description. However, one or more of the processes may be performed in a different order or may not be performed at all (and thus be optional), in accordance with some embodiments. Numerous variations on method 700 and the techniques described herein will be apparent in light of this disclosure.

FURTHER EXAMPLE EMBODIMENTS

The following examples pertain to further embodiments, from which numerous permutations and configurations will be apparent.

Example 1. An apparatus for converting frequency of signals, comprising: a first switch having (i) a first input terminal configured to receive a first input signal, (ii) a first output terminal, and (iii) a second output terminal, wherein the first switch is configured to couple the first input terminal to either the first output terminal or the second output terminal; a mixer circuit coupled to the second output terminal of the first switch, wherein in response the first switch coupling the first input terminal to the second output terminal, the mixer circuit is configured to mix the first input signal to a second input signal, to generate a modified input signal; a filter circuit comprising a plurality of programmable filters, the filter circuit configured to receive the modified input signal and output a filtered signal; and a second switch having (i) a second input terminal coupled to the first output terminal of the first switch, (ii) a third input terminal coupled to an output of the filter circuit, and (iii) a third output terminal, wherein the second switch is configured to couple the third output terminal to either of the second input terminal or the third input terminal.

Example 2. The apparatus of example 1, further comprising: a controller to control the first switch and the second switch, such that either (i) the first input terminal of the first switch is coupled to the first output terminal of the first switch, and the second input terminal of the second switch is coupled to the third output terminal of the second switch, or (ii) the first input terminal of the first switch is coupled to the second output terminal of the first switch, and the third input terminal of the second switch is coupled to the third output terminal of the second switch.

Example 3. The apparatus of any one of examples 1-2, wherein: the plurality of programmable filters comprises a plurality of programmable high-pass filters and a plurality of programmable low-pass filters, wherein each programmable high and law pass filter has a corresponding plurality of states, such that each state of a programmable high-pass or low-pass filter is associated with a corresponding passband.

Example 4. The apparatus of example 3, further comprising: a controller configured to generate (i) a first control signal that is to select a first programmable high-pass filter, (ii) a second control signal that is to select a first state of the first programmable high-pass filter corresponding to a first passband, (iii) a third control signal that is to select a first programmable low-pass filter, (iv) a fourth control signal that is to select a second state of the first programmable low-pass filter corresponding to a second passband; and wherein in response to the first, second, third, and fourth control signals, the first programmable high-pass filter and the first programmable low-pass filter are configured to operate at the first passband and the second passband, respectively, and in series, to process the modified input signal and output the filtered signal.

Example 5. The apparatus of any one of examples 1-4, wherein the filter circuit comprises: a demultiplexer configured to receive the modified input signal, the demultiplexer having a first plurality of output terminals; a plurality of programmable high-pass filters, each programmable high-pass filter of the plurality of programmable high-pass filters having a corresponding input coupled to a respective one of the first plurality of output terminals of the demultiplexer; and a multiplexer comprising a plurality of first input terminals, each input terminal of the plurality of first input terminals of the multiplexer coupled to a corresponding output of a corresponding programmable high-pass filter of the plurality of programmable high-pass filters.

Example 6. The apparatus of example 5, wherein the demultiplexer is a first demultiplexer, wherein the multiplexer is a first multiplexer, and wherein the filter circuit further comprises: a second demultiplexer configured to receive an output of the first multiplexer, the second demultiplexer having a second plurality of output terminals; a plurality of programmable low-pass filters, each programmable low-pass filter of the plurality of programmable low-pass filters having a corresponding input coupled to a respective one of the second plurality of output terminals of the second demultiplexer; and a second multiplexer comprising a plurality of second input terminals, each input terminal of the plurality of second input terminals of the second multiplexer coupled to a corresponding output of a corresponding programmable low-pass filter of the plurality of programmable low-pass filters.

Example 7. The apparatus of example 6, wherein: each programmable high-pass and low-pass filter is configured to operate at one of a corresponding plurality of states, such that each state of a programmable high-pass or low-pass filter is associated with a corresponding passband; and the apparatus further comprises a controller configured to generate (i) a first control signal that is to configure the first demultiplexer, such that the first demultiplexer outputs the modified input signal to a first programmable high-pass filter of the plurality of programmable high-pass filters, (ii) a second control signal that is to select a first state of the first programmable high-pass filter corresponding to a first passband, such that the first programmable high-pass filter processes the modified input signal in accordance with the first passband and outputs an intermediate signal, (iii) a third control signal that is to configure the first multiplexer, such that the first multiplexer receives the intermediate signal from the first programmable high-pass filter and outputs the intermediate signal, (iv) a fourth control signal that is to configure the second demultiplexer, such that the second demultiplexer receives the intermediate signal and outputs the intermediate signal to a first programmable low-pass filter, (v) a fifth control signal that is to select a second state of the first programmable low-pass filter corresponding to a second pass band, such that the first programmable low-pass filter processes the intermediate signal in accordance with the second passband and outputs the filtered signal, and (vi) a sixth control signal that is to configure the second multiplexer, such that the second multiplexer receives the filtered signal from the first programmable low-pass filter and outputs the filtered signal from the filter circuit.

Example 8. The apparatus of any one of examples 1-7, wherein: the first input signal has a first frequency; the second input signal has a second frequency; and the mixer circuit is configured to mix the first input signal to the second input signal, such that the modified input signal has (i) a first frequency component that is a sum of the first frequency and the second frequency, and (ii) a second frequency component that is a difference between the first frequency and the second frequency.

Example 9. The apparatus of example 8, wherein the filter circuit is configured to filter out one of the first or second frequency components from the modified input signal, such that the filtered signal comprises the other of the first or second frequency components.

Example 10. The apparatus of any one of examples 1-9, wherein the mixer is a heterodyne frequency mixer.

Example 11. The apparatus of any one of examples 1-10, further comprising: an input amplifier and attenuation circuit configured to selectively amplify and/or attenuate a first signal and generate the input signal.

Example 12. The apparatus of example 11, wherein the input amplifier and attenuation circuit comprises: a first amplifier configured to amplify the first signal and generate a second signal; an attenuator configured to attenuate the second signal and generate a third signal; and a second amplifier configured to amplify the third signal and generate the input signal.

Example 13. The apparatus of example 12, wherein the apparatus further comprises: a controller configured to control an attenuation factor of the attenuator, to at least in part compensate for a variation of gains of one or both the first and second amplifiers in response to a temperature variation and to control a gain of the input amplifier and attenuation circuit.

Example 14. The apparatus of any one of examples 1-13, further comprising: an output amplifier and attenuation circuit configured to selectively amplify and/or attenuate an output of the second switch and generate an output signal.

Example 15. The apparatus of example 14, wherein the output amplifier and attenuation circuit comprises: an attenuator configured to attenuate an output of the second switch; and an amplifier configured to amplify the output of the attenuator and generate an output signal; wherein the apparatus further comprises a controller configured to control an attenuation factor of the attenuator, to at least in part compensate for a variation of gains of one or both the attenuator and the amplifier in response to a temperature variation.

Example 16. A method of operating a frequency converter, comprising: outputting, by a first switch, a first input signal to either (i) a first output terminal of the first switch, in response to a controller indicating that a frequency of the first input signal is not to be changed by the frequency converter, or (ii) a second output terminal of the first switch, in response to the controller indicating that the frequency of the first input signal is to be changed by the frequency converter; in response to the controller indicating that the frequency of the first input signal is to be changed, mixing the first input signal with a second input signal to generate a modified input signal; filtering the modified input signal using a filter circuit comprising a plurality of programmable filters, to output a filtered signal; receiving, at a second switch, (i) the filtered signal from the filter circuit, and (ii) an output from the first output terminal of the first switch; and outputting, by the second switch, one of (i) the filtered signal from the filter circuit, or (ii) the output from the first output terminal of the first switch.

Example 17. The method of example 16, wherein the plurality of programmable filters comprises (i) a plurality of high-pass filters arranged in parallel, and (ii) a plurality of low-pass filters arranged in parallel, wherein each high and law pass filter has a corresponding plurality of operation states, such that each state of a high-pass or low-pass filter is associated with a corresponding passband, and wherein filtering the modified input signal using the filter circuit comprises: selecting a high-pass filter from the plurality of high-pass filters, and selecting a first state from the plurality of operation states for the selected high-pass filter; selecting a low-pass filter from the plurality of low-pass filters, and selecting a second state from the plurality of operation states for the selected low-pass filter; and operating (i) the selected high-pass filter at the selected first state of operation and (ii) the selected low-pass filter at the selected low state of operation, to filter the modified input signal and to output the filtered signal.

Example 18. The method of any one of examples 16-17, further comprising: while operating the selected high-pass filter and the selected low-pass filter, refraining from operating other non-selected high-pass and low-pass filters.

Example 19. An apparatus for converting frequency of signals, comprising: a first switch having (i) a first input terminal, (ii) a first output terminal, and (iii) a second output terminal; a mixer circuit coupled to the second output terminal of the first switch; a filter circuit comprising (i) a plurality of high-pass filters arranged in parallel, and (ii) a plurality of low-pass filters arranged in parallel, wherein each high and law pass filter has a corresponding plurality of operation states, such that each state of a high-pass or low-pass filter is associated with a corresponding passband; and a second switch having (i) a second input terminal coupled to the first output terminal of the first switch, (ii) a third input terminal coupled to an output of the filter circuit, and (iii) a third output terminal.

Example 20. The apparatus of example 19, further comprising: a controller to (i) generate a first control signal to select a high-pass filter of the plurality of high-pass filters, (ii) generate a second control signal to select a first state of the selected high-pass filter, (iii) generate a third control signal to select a low-pass filter of the plurality of low-pass filters, and (iv) generate a fourth control signal to select a second state of the selected low-pass filter; wherein the selected high-pass filter is configured to operate at the selected first state and the selected low-pass filter is configured to operate at the selected second state, such that the selected high-pass filter and the selected low-pass filter operates in series and processes an output of the mixer and generates a filtered signal that is received by the third input terminal of the second switch.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An apparatus for converting frequency of signals, comprising:
    a first switch having (i) a first input terminal configured to receive a first input signal, (ii) a first output terminal, and (iii) a second output terminal, wherein the first switch is configured to couple the first input terminal to either the first output terminal or the second output terminal;
    a mixer circuit coupled to the second output terminal of the first switch, wherein in response the first switch coupling the first input terminal to the second output terminal, the mixer circuit is configured to mix the first input signal to a second input signal, to generate a modified input signal;
    a filter circuit comprising a plurality of programmable filters, the filter circuit configured to receive the modified input signal and output a filtered signal; and
    a second switch having (i) a second input terminal coupled to the first output terminal of the first switch, (ii) a third input terminal coupled to an output of the filter circuit, and (iii) a third output terminal, wherein the second switch is configured to couple the third output terminal to either of the second input terminal or the third input terminal.

2. The apparatus of claim 1, further comprising:
    a controller to control the first switch and the second switch, such that either (i) the first input terminal of the first switch is coupled to the first output terminal of the first switch, and the second input terminal of the second switch is coupled to the third output terminal of the second switch, or (ii) the first input terminal of the first switch is coupled to the second output terminal of the first switch, and the third input terminal of the second switch is coupled to the third output terminal of the second switch.

3. The apparatus of claim 1, wherein:
    the plurality of programmable filters comprises a plurality of programmable high-pass filters and a plurality of programmable low-pass filters, wherein each programmable high and law pass filter has a corresponding plurality of states, such that each state of a programmable high-pass or low-pass filter is associated with a corresponding passband.

4. The apparatus of claim 3, further comprising:
    a controller configured to generate (i) a first control signal that is to select a first programmable high-pass filter, (ii) a second control signal that is to select a first state of the first programmable high-pass filter corresponding to a first passband, (iii) a third control signal that is to select a first programmable low-pass filter, (iv) a fourth control signal that is to select a second state of the first programmable low-pass filter corresponding to a second passband; and
    wherein in response to the first, second, third, and fourth control signals, the first programmable high-pass filter and the first programmable low-pass filter are configured to operate at the first passband and the second passband, respectively, and in series, to process the modified input signal and output the filtered signal.

5. The apparatus of claim 1, wherein the filter circuit comprises:
    a demultiplexer configured to receive the modified input signal, the demultiplexer having a first plurality of output terminals;
    a plurality of programmable high-pass filters, each programmable high-pass filter of the plurality of programmable high-pass filters having a corresponding input coupled to a respective one of the first plurality of output terminals of the demultiplexer; and
    a multiplexer comprising a plurality of first input terminals, each input terminal of the plurality of first input terminals of the multiplexer coupled to a corresponding output of a corresponding programmable high-pass filter of the plurality of programmable high-pass filters.

6. The apparatus of claim 5, wherein the demultiplexer is a first demultiplexer, wherein the multiplexer is a first multiplexer, and wherein the filter circuit further comprises:
    a second demultiplexer configured to receive an output of the first multiplexer, the second demultiplexer having a second plurality of output terminals;
    a plurality of programmable low-pass filters, each programmable low-pass filter of the plurality of programmable low-pass filters having a corresponding input coupled to a respective one of the second plurality of output terminals of the second demultiplexer; and
    a second multiplexer comprising a plurality of second input terminals, each input terminal of the plurality of second input terminals of the second multiplexer coupled to a corresponding output of a corresponding programmable low-pass filter of the plurality of programmable low-pass filters.

7. The apparatus of claim 6, wherein:
    each programmable high-pass and low-pass filter is configured to operate at one of a corresponding plurality of states, such that each state of a programmable high-pass or low-pass filter is associated with a corresponding passband; and
    the apparatus further comprises a controller configured to generate
    (i) a first control signal that is to configure the first demultiplexer, such that the first demultiplexer outputs the modified input signal to a first programmable high-pass filter of the plurality of programmable high-pass filters,
    (ii) a second control signal that is to select a first state of the first programmable high-pass filter corresponding to a first passband, such that the first programmable high-pass filter processes the modified input signal in accordance with the first passband and outputs an intermediate signal,
    (iii) a third control signal that is to configure the first multiplexer, such that the first multiplexer receives the intermediate signal from the first programmable high-pass filter and outputs the intermediate signal, (iv) a fourth control signal that is to configure the second demultiplexer, such that the second demultiplexer receives the intermediate signal and outputs the intermediate signal to a first programmable low-pass filter, (v) a fifth control signal that is to select a second state of the first programmable low-pass filter corresponding to a second pass band, such that the first programmable low-pass filter processes the intermediate signal in accordance with the second passband and outputs the filtered signal, and (vi) a sixth control signal that is to configure the second multiplexer, such that the second multiplexer receives the filtered signal from the first programmable low-pass filter and outputs the filtered signal from the filter circuit.

8. The apparatus of claim 1, wherein:
the first input signal has a first frequency;
the second input signal has a second frequency; and
the mixer circuit is configured to mix the first input signal to the second input signal, such that the modified input signal has (i) a first frequency component that is a sum of the first frequency and the second frequency, and (ii) a second frequency component that is a difference between the first frequency and the second frequency.

9. The apparatus of claim 8, wherein the filter circuit is configured to filter out one of the first or second frequency components from the modified input signal, such that the filtered signal comprises the other of the first or second frequency components.

10. The apparatus of claim 1, wherein the mixer is a heterodyne frequency mixer.

11. The apparatus of claim 1, further comprising:
an input amplifier and attenuation circuit configured to selectively amplify and/or attenuate a first signal and generate the input signal.

12. The apparatus of claim 11, wherein the input amplifier and attenuation circuit comprises:
a first amplifier configured to amplify the first signal and generate a second signal;
an attenuator configured to attenuate the second signal and generate a third signal; and
a second amplifier configured to amplify the third signal and generate the input signal.

13. The apparatus of claim 12, wherein the apparatus further comprises:
a controller configured to control an attenuation factor of the attenuator, to at least in part compensate for a variation of gains of one or both the first and second amplifiers in response to a temperature variation and to control a gain of the input amplifier and attenuation circuit.

14. The apparatus of claim 1, further comprising:
an output amplifier and attenuation circuit configured to selectively amplify and/or attenuate an output of the second switch and generate an output signal.

15. The apparatus of claim 14, wherein the output amplifier and attenuation circuit comprises:
an attenuator configured to attenuate an output of the second switch; and
an amplifier configured to amplify the output of the attenuator and generate an output signal;
wherein the apparatus further comprises a controller configured to control an attenuation factor of the attenuator, to at least in part compensate for a variation of gains of one or both the attenuator and the amplifier in response to a temperature variation.

16. A method of operating a frequency converter, comprising:
outputting, by a first switch, a first input signal to either (i) a first output terminal of the first switch, in response to a controller indicating that a frequency of the first input signal is not to be changed by the frequency converter, or (ii) a second output terminal of the first switch, in response to the controller indicating that the frequency of the first input signal is to be changed by the frequency converter;
in response to the controller indicating that the frequency of the first input signal is to be changed, mixing the first input signal with a second input signal to generate a modified input signal;
filtering the modified input signal using a filter circuit comprising a plurality of programmable filters, to output a filtered signal;
receiving, at a second switch, (i) the filtered signal from the filter circuit, and (ii) an output from the first output terminal of the first switch; and
outputting, by the second switch, one of (i) the filtered signal from the filter circuit, or (ii) the output from the first output terminal of the first switch.

17. The method of claim 16, wherein the plurality of programmable filters comprises (i) a plurality of high-pass filters arranged in parallel, and (ii) a plurality of low-pass filters arranged in parallel, wherein each high and law pass filter has a corresponding plurality of operation states, such that each state of a high-pass or low-pass filter is associated with a corresponding passband, and wherein filtering the modified input signal using the filter circuit comprises:
selecting a high-pass filter from the plurality of high-pass filters, and selecting a first state from the plurality of operation states for the selected high-pass filter;
selecting a low-pass filter from the plurality of low-pass filters, and selecting a second state from the plurality of operation states for the selected low-pass filter; and
operating (i) the selected high-pass filter at the selected first state of operation and (ii) the selected low-pass filter at the selected low state of operation, to filter the modified input signal and to output the filtered signal.

18. The method of claim 16, further comprising:
while operating the selected high-pass filter and the selected low-pass filter, refraining from operating other non-selected high-pass and low-pass filters.

19. An apparatus for converting frequency of signals, comprising:
a first switch having (i) a first input terminal, (ii) a first output terminal, and (iii) a second output terminal;
a mixer circuit coupled to the second output terminal of the first switch;
a filter circuit comprising (i) a plurality of high-pass filters arranged in parallel, and (ii) a plurality of low-pass filters arranged in parallel, wherein each high and law pass filter has a corresponding plurality of operation states, such that each state of a high-pass or low-pass filter is associated with a corresponding passband; and
a second switch having (i) a second input terminal coupled to the first output terminal of the first switch, (ii) a third input terminal coupled to an output of the filter circuit, and (iii) a third output terminal.

20. The apparatus of claim 19, further comprising:
a controller to (i) generate a first control signal to select a high-pass filter of the plurality of high-pass filters, (ii) generate a second control signal to select a first state of the selected high-pass filter, (iii) generate a third control signal to select a low-pass filter of the plurality of low-pass filters, and (iv) generate a fourth control signal to select a second state of the selected low-pass filter;

wherein the selected high-pass filter is configured to operate at the selected first state and the selected low-pass filter is configured to operate at the selected second state, such that the selected high-pass filter and the selected low-pass filter operates in series and processes an output of the mixer and generates a filtered signal that is received by the third input terminal of the second switch.

* * * * *